US005875136A

United States Patent [19]

Hsuan et al.

[11] Patent Number: 5,875,136

[45] Date of Patent: Feb. 23, 1999

[54] REPAIRABLE MEMORY MODULE AND METHOD OF REPAIRING MEMORY MODULES

[75] Inventors: Min-Chih Hsuan; Jerry Jaw; Charlie Han, all of Taipei, Taiwan

[73] Assignee: United Microelectronics Corporation, Taiwan

[21] Appl. No.: 907,642

[22] Filed: Aug. 11, 1997

[30] Foreign Application Priority Data

Jul. 3, 1997 [TW] Taiwan ................................ 86109361

[51] Int. Cl.[6] ........................................ G11C 5/06

[52] U.S. Cl. ................................ 365/200; 365/63

[58] Field of Search ........................ 365/200, 63, 225.7; 371/10.1, 10.2, 10.3

[56] References Cited

U.S. PATENT DOCUMENTS

| | | | |
|---|---|---|---|
| 5,315,552 | 5/1994 | Yoneda | 365/63 |
| 5,544,113 | 8/1996 | Kirihata et al. | 365/200 |
| 5,550,394 | 8/1996 | Sukegawa et al. | 365/200 |
| 5,559,743 | 9/1996 | Pascucci et al. | 365/63 |
| 5,691,946 | 11/1997 | DeBrosse et al. | 365/200 |

*Primary Examiner*—Son T. Dinh

*Attorney, Agent, or Firm*—Rabin & Champagne, P.C.

[57] ABSTRACT

A repairable memory module, such as a DRAM (dynamic random access memory) or a flash memory module, and a method of repairing memory modules are proposed. Based on the repairable memory module, any failed memory ICs in the module that are found before shipment or after use can be repaired through the use of a backup memory IC. Fundamentally, when any failed memory ICs are found in the module, a set of zero-ohm resistors are used to short-circuit a number of selected pairs of jumping pads to thereby redirect the connections to the I/O (input/output) and column-address strobe pins on the failed memory IC instead to the same nominal pins on the backup memory IC. This allows the function of the failed ICs to be instead performed by the backup memory chip.

10 Claims, 6 Drawing Sheets

REPAIRABLE MEMORY MODULE AND METHOD OF REPAIRING MEMORY MODULES

BACKGROUND OF THE INVENTION

1. Field of the Invention

This invention relates to memory modules, and more particularly, to a repairable memory module, such as a DRAM (dynamic random access memory) module, and a method of repairing such memory modules.

2. Description of Related Art

FIG. 1 is a schematic diagram of a conventional DRAM module which is designed for use with a 32-bit Pentium microprocessor on a personal computer. The DRAM module includes an array of eight 1M×4 DRAM ICs which are used together to constitute a 1M×32 SIMM (Single In-line Memory Module).

FIG. 2 shows a schematic top view of the conventional DRAM module of FIG. 1 when assembled. As shown, the DRAM module is formed by mounting eight DRAM ICs U1-U8 on a printed circuit board (PCB). The I/O (input/output) pins on these DRAM ICs are connected to corresponding I/O pins of the DRAM module.

Most conventional memory modules, as DRAM or flash memory modules, are manufactured by first arranging them in packaged form on a PCB and then separating them from the PCB so that they can serve as individual memory modules. These memory modules are then tested respectively through the so-called module testing process to check for any failed memory ICs in the module. If any memory IC is found to be failed, a conventional method for repairing the failed IC is simply to dismount the failed IC and then replaced it with a new, good one. This repair work, however, is quite laborious to carry out.

FIG. 3 is a flow diagram showing the procedural steps involved in a conventional module testing process to check for any failed ICs in the modules. As shown, if a memory module is OK, it is then ready for shipment to the customer; otherwise, the failed memory IC in the memory module is dismounted and then replaced with a new, good one. These two steps are collectively referred to a rework process, which is usually quite laborious and thus cost-ineffective to carry out.

A conventional method for manufacturing low-cost memory modules is to use the so-called chip-on-board (COB) technique. However, in a memory module based on the COB structure, the repair work for the failed ICs is difficult to carry out even before encapsulation is applied. After encapsulation, the repair work would be extremely difficult to carry out.

SUMMARY OF THE INVENTION

It is therefore a primary objective of the present invention to provide a repairable memory module which allows the failed memory ICs in the memory module, if any, to be repaired conveniently without having to laboriously dismounting the failed IC and then mounting a new, good one on the printed circuit board.

It is another objective of the present invention to provide a method of repairing memory module without having to replace the failed ICs with new, good ones.

In accordance with the foregoing and other objectives of the present invention, a repairable memory module and a method of repairing memory modules are provided.

The repairable memory module of the invention includes the following constituent elements:

(a) a printed circuit board;

(b) a plurality of regular memory ICs mounted on said printed circuit board;

(c) at least one backup memory IC selectively mounted on said printed circuit board when required, said backup memory IC being used to repair any failed one of said regular memory ICs;

(d) a module I/O bus having a plurality of I/O pins for said memory module;

(e) a number of I/O jumping-pad units, each I/O jumping-pad unit being associated with one of said regular memory ICs, each I/O jumping-pad unit being arranged into at least three rows of jumping pads with the number of jumping pads in each row being equal to the number of I/O pins on the associated memory IC; and (f) at least one CAS jumping-pad unit associated with said backup memory IC, said CAS jumping-pad unit being arranged into at least two rows of jumping pads with the number of jumping pads in each row being equal to the number of CAS pins on said module I/O bus;

Moreover, in each of said I/O jumping-pad units, the first row of jumping pads are connected respectively to the I/O pins on the associated one of said regular memory ICs; the second row of jumping pads are connected respectively to the corresponding I/O pins on the module I/O bus; and the third row of jumping pads are connected respectively to the I/O pins on the backup memory IC. And in said CAS jumping-pad unit, the first row of jumping pads are connected together to the CAS pin on the backup memory IC; and the second row of jumping pads are connected respectively to the corresponding CAS pins on the module I/O bus.

Through the module testing process, provided that all of the regular memory ICs are OK, the first row of jumping pads in each of said I/O jumping-pad units are short-circuited to the second row of jumping pads in the same; whereas provided that at least one of the regular memory ICs is a failed one, those jumping pads in the second row of jumping pads that are associated with the failed I/O pins on the failed memory IC are short-circuited to the corresponding jumping pads in the third row; those jumping pads in the first row of jumping pads that are associated with the unfailed I/O pins on the regular memory ICs are short-circuited to the corresponding jumping pads in the second row; and those jumping pads in the first row of the CAS jumping-pad unit that are associated with the failed memory ICs are short-circuited to the corresponding jumping pads in the second row.

In various other embodiments, the regular memory ICs and said backup memory IC are mounted on the printed circuit board in packaged form; or alternatively, said regular memory ICs and said backup memory IC are mounted on the printed circuit board by chip-on-board; and still alternatively, said regular memory ICs are mounted on said printed circuit board by chip-on-board while the backup memory IC is mounted on said printed circuit board in packaged form.

Moreover, the short-circuited connections can be realized by either using a set of zero-ohm resistors or a set of jumpers which are mounted respectively on the short-circuited pairs of the jumping pads.

The maximum repair capacity of the foregoing repairable memory module of the invention, i.e., the maximum number of failed ICs in the module that can be repaired, is equal to the number of the I/O pins of the backup memory IC.

In another aspect, the invention provides a method for repairing memory modules. Specifically, this method is utilized on a memory module having an array of regular memory ICs and a module I/O bus associated with the regular memory ICs for repairing at least one failed one of the regular memory ICs. The method of the invention includes the following procedural steps of:

(1) providing a backup memory IC of the same type as the regular memory ICs;

(2) short-circuiting the failed I/O pins on the failed memory IC to the corresponding I/O pins on the backup memory IC;

(3) short-circuiting the unfailed I/O pins on the regular memory ICs to the corresponding I/O pins on the module I/O bus; and (4) short-circuiting the CAS pin on the backup memory IC to the corresponding CAS pins on the module I/O bus that are associated with the failed memory IC.

For the realization of the short-circuited connections, the method further includes the following procedural steps:

providing a number of I/O jumping-pad units, each I/O jumping-pad unit being associated with one of said regular memory ICs, each I/O jumping-pad unit being arranged into at least three rows of jumping pads with the number of jumping pads in each row being equal to the number of I/O pins on the associated memory IC; in each of said I/O jumping-pad units, the first row of jumping pads being connected respectively to the I/O pins on the associated one of said regular memory ICs; the second row of jumping pads being connected respectively to the corresponding I/O pins on the module I/O bus; and the third row of jumping pads being connected respectively to the I/O pins on the backup memory IC; and providing at least one set of CAS jumping pads associated with said backup memory IC, said CAS jumping-pad unit being arranged into at least two rows of jumping pads with the number of jumping pads in each row being equal to the number of CAS pins on said module I/O bus; in said CAS jumping-pad unit, the first row of jumping pads being connected together to the CAS pin on the backup memory IC; and the second row of jumping pads being connected respectively to the corresponding CAS pins on the module I/O bus.

Moreover, the short-circuited connections can be realized by either using a set of zero-ohm resistors or a set of jumpers which are mounted respectively on the short-circuited pairs of the jumping pads. The maximum repair capacity of the foregoing repairable memory module of the invention, i.e., the maximum number of failed ICs in the module that can be repaired, is equal to the number of the I/O pins of the backup memory IC.

BRIEF DESCRIPTION OF DRAWINGS

The invention can be more fully understood by reading the following detailed description of the preferred embodiments, with reference made to the accompanying drawings, wherein.

DETAILED DESCRIPTION OF PREFERRED EMBODIMENTS

As described in the background section of this specification, a memory module is constructed by forming an array of memory ICs (which are hereinafter referred to as the "regular memory ICs") on a printed circuit board (PCB). The storage capacity of the memory module is the sum of these regular memory ICs. In accordance with the invention, at least one additional memory IC (hereinafter referred to as "backup memory IC"), is incorporated in the memory module. When any one of the regular memory ICs in the module is found to be failed, the failed IC can be repaired by using the backup memory IC in a predetermined manner which will be described in details in the following.

If the module is based on an array of packaged memory ICs, the backup memory IC needs not to be mounted on the PCB until it is necessary to do any repairs. If the module is based on the chip-on-board (COB) structure, the backup memory IC can be either mounted along with the regular memory ICs on the circuit board in the manufacturing stage, or alternatively supplied in packaged form which is to be mounted onto a reserved area on the module at a later time when it is necessary to do any repairs.

Fundamentally, when any failed memory ICs are found in the module, a set of zero-ohm resistors (jumpers) are used to short-circuit a selected number of paired jumping pads provided on the PCB to thereby redirect the connections to the I/O (input/output) and CAS (column-address strobe) pins on the failed memory IC instead to the same nominal pins on the backup memory IC. Preferred embodiments of the invention in accordance with this concept are disclosed in the following with reference to FIGS. 4 through 6.

Figure 1:
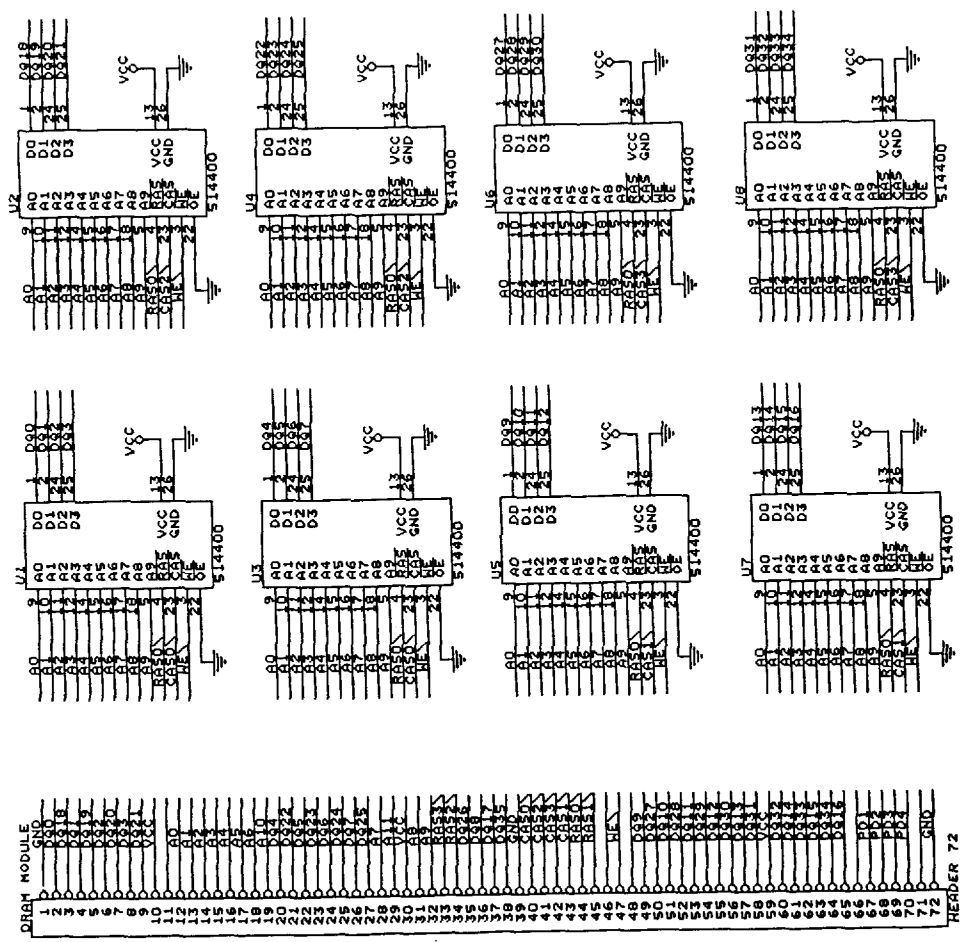
FIG. 1 is a schematic diagram of a conventional DRAM module which is designed for use with a 32-bit Pentium microprocessor on a PC.
Figure 2:
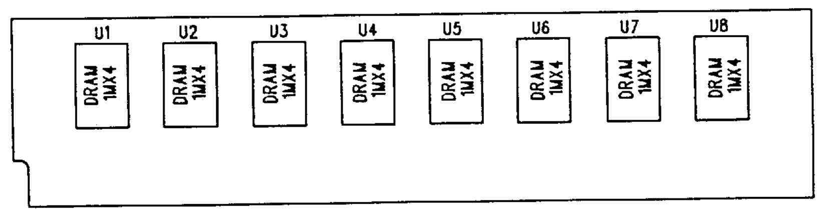
FIG. 2 shows a schematic top view of the conventional DRAM module of FIG. 1 when assembled.
Figure 3:
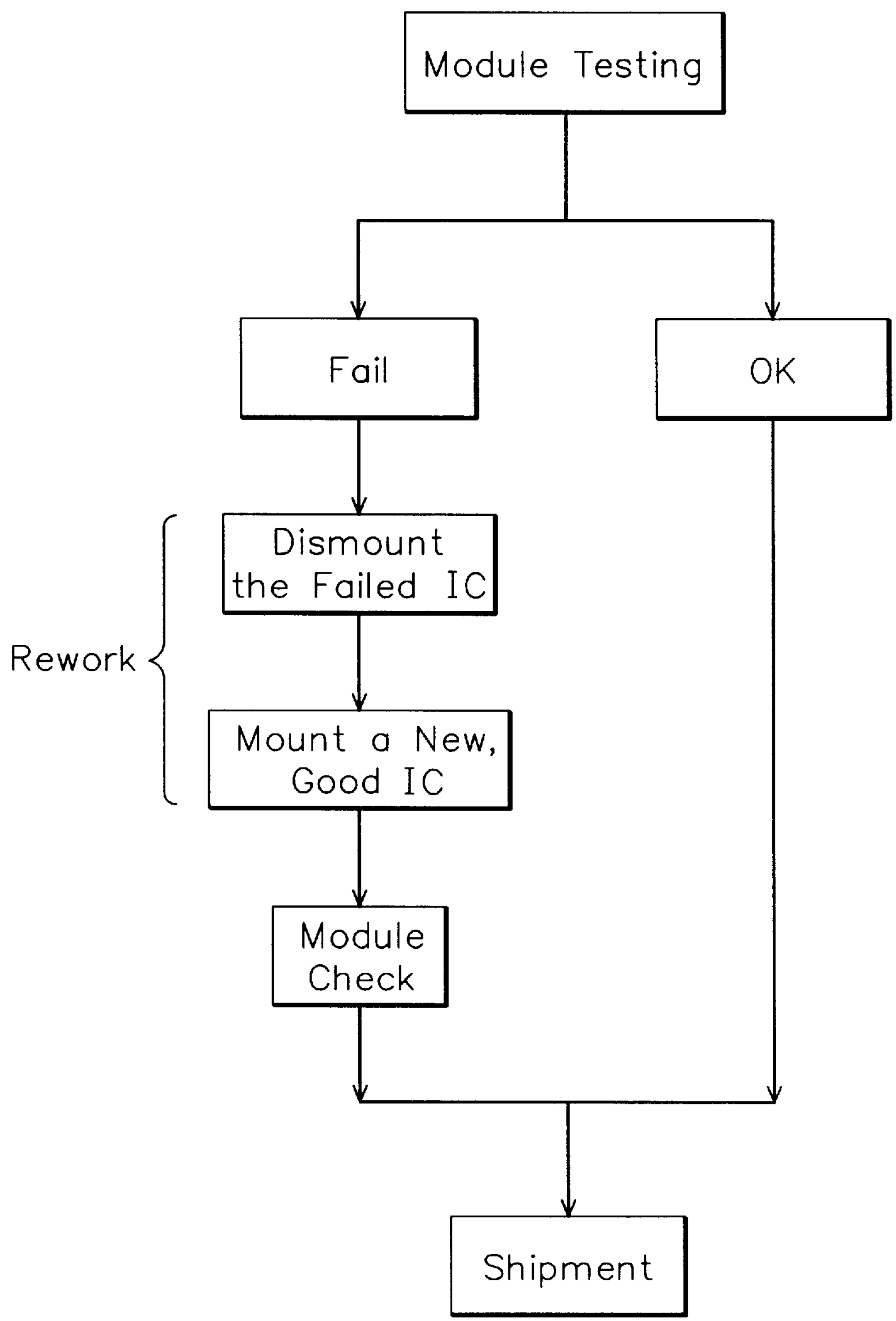
FIG. 3 is a flow diagram showing the procedural steps involved in a conventional method for repairing a conventional DRAM module.
Figure 4:
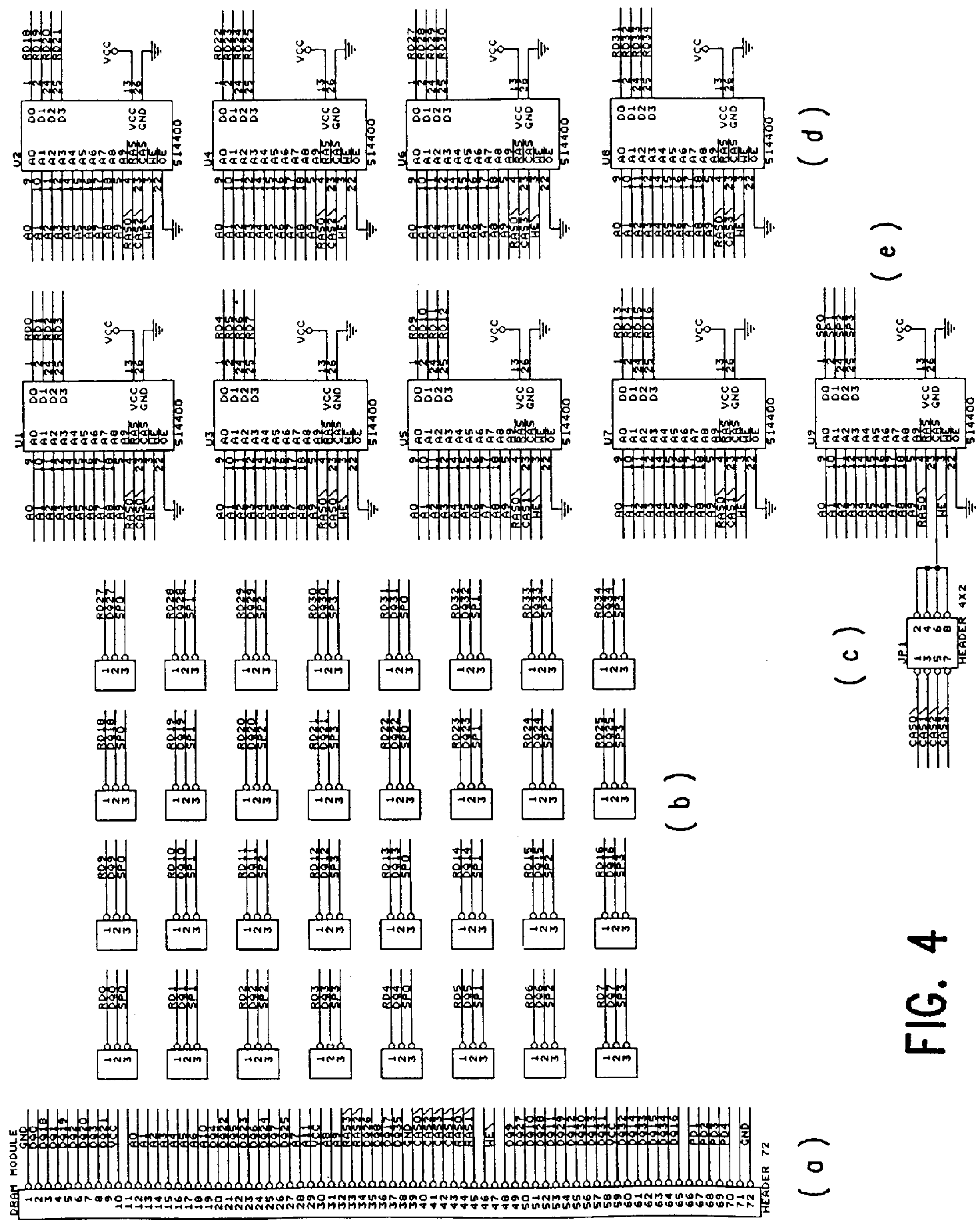
FIG. 4 is a schematic diagram showing various constituent parts of the repairable DRAM module of the invention.
Figure 5:
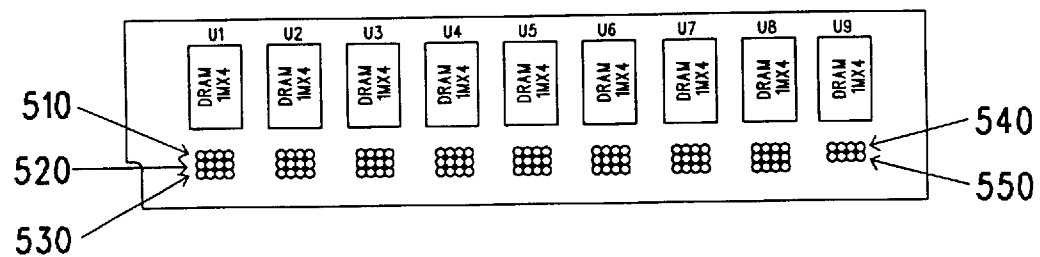
FIG. 5 shows a schematic top view of the DRAM module of FIG. 4 when assembled.

FIG. 4 is a schematic diagram showing five constituent parts, respectively designated by (a), (b), (c), (d) and (e), of the repairable memory module of the invention; while FIG. 5 shows a schematic top view of the repairable memory module when assembled. In this embodiment, the memory module has a nominal capacity of 1M×32 which is constructed by forming an array of eight 1M×4 DRAM ICs U1-U8 (which serve as the regular memory ICs) and one additional 1M×4 DRAM IC U9 (which serve as the backup memory IC).

In FIG. 4, (a) designates a module I/O bus; (b) designates a number of I/O jumping-pad units J0-J7, J9-J16, J18-J25, J27-J34 that are to be used to connect I/O pins on the working DRAM chips U1-U8 to the I/O pins on the module I/O bus; (c) designates a CAS jumping-pad unit JP1 that is to be used to connect the CAS (column address strobe) pin on the backup memory chip to the corresponding CAS pins on the module I/O bus; (d) designates the eight regular DRAM ICs U1-U8; and (e) designates the backup DRAM IC U9.

Moreover, as shown in FIG. 5, each of the regular DRAM ICs U1-U8 is associated with three jumping-pad rows 510, 520, 530, each row having four jumping pads. These three jumping-pad rows 510, 520, 530 are implemented by using the I/O jumping-pad units J0-J7, J9-J16, J18-J25, J27-J34. If the 1M×32 module is alternatively formed by using two 1M×16 DRAM ICs, each of the row should have 16 jumping pads which correspond to 16 I/O pins on the module I/O bus.

As shown in FIG. 4(*b*), the first row of jumping pads 510 are connected respectively to the I/O pins on the associated ones of the regular DRAM ICs U1-U8. For example, for the first regular DRAM IC U1, the associated four jumping pads in the first row 510 are connected respectively to the RD0-RD3 pins on the DRAM IC U1; the associated four jumping pads in the second row 520 are connected respectively to the DQ0-DQ3 pins on the module I/O bus; and the associated four jumping pads in the third row 530 are connected respectively to the SP0-SP3 pins on the backup DRAM IC U9. For the other regular DRAM ICs U2-U8, the associated jumping pads are connected in a similar manner. In module testing, the jumping pads in first row 510 are also used for the chip-probe testing on the associated ones of the regular DRAM ICs U1-U8.

The backup DRAM IC U9 is associated with two jumping-pad rows 540, 550, each row having four jumping pads. These two jumping-pad rows 540, 550 are implemented by using the CAS jumping-pad unit JP1. As shown in FIG. 4(*c*), the jumping pads in the top row 540 (2, 4, 6, 8 on JP1) are connected together to the $\overline{CAS}$ pin on the backup DRAM IC U9; while the jumping pads in the bottom row 550 (1, 3, 5, 7 on JP1) are connected to various column-address strobe pins on the regular DRAM ICs U1-U8 as given in the following Table 1.

TABLE 1

| Jumping Pad | DRAM IC |
|---|---|
| 1 (JP1) | $\overline{CAS0}$ (U1 & U3) |
| 3 (JP1) | $\overline{CAS1}$ (U5 & U7) |
| 5 (JP1) | $\overline{CAS2}$ (U2 & U4) |
| 7 (JP1) | CAS3 (U6 & U8) |

After the module is assembled, the subsequent step is to perform a module testing process to check for any failed ICs in the module.

If all of the regular DRAM ICs U1-U8 in the module are OK (no failed one is found), a number of zero-ohm resistors or jumpers are used to short-circuit the jumping pads in the first row 510 respectively to the corresponding ones in the second row 520 for all of the regular DRAM ICs U1-U8, but the two rows of jumping pads 540, 550 associated with the backup DRAM IC U9 are not short-circuited by zero-ohm resistors (i.e., all of the paired jumping pads in JP1 shown in FIG. 4(*c*) remain open-circuited). This causes the first and second jumping pads in each of the I/O jumping-pad units J0-J7, J9-J16, J18-J25, J27-J34 to be short-circuited. For the first regular DRAM ICs U1, the mounting of the zero-ohm resistors causes the RD0-RD3 pins on the first regular DRAM IC U1 to be short-circuited respectively to the DQ0-DQ3 pins on the module I/O bus. For the other regular DRAM ICs U2-U8, the short-circuited connections are carried out in a similar manner.

If the module is based on the COB structure, the backup DRAM IC needs not be mounted at the time of manufacture until any failed chips are found in the module. If the module is based on packaged DRAM ICs, the layout area reserved for the backup DRAM IC can be left unoccupied until any failed chips are found in the module.

On the other hand, if the module fails to pass the testing, meaning that at least one of the regular DRAM ICs U1-U8 is failed, the backup DRAM IC U9 will be used to repair the failed IC. The repair work involved is to mount a set of zero-ohm resistors on selected pairs of the jumping pads so as to redirect the connections to the I/O pins and column-address strobe pin on the failed IC instead to the same nominal pins on the backup DRAM IC U9. Specifically, in the repair work, a first set of zero-ohm resistors are used to short-circuit the jumping pads in the second row 520 associated with the failed IC respectively to the corresponding ones in the third row 530; then for the unfailed ICs, a second set of zero-ohm resistors are used to short-circuit the jumping pads in the first row 510 respectively to the corresponding ones in the second row 520; and moreover, for the backup DRAM IC U9, a third set of zero-ohm resistors are used to short-circuit the jumping pads in the bottom row 550 respectively to the corresponding ones in top row of 540 (as the connections given in Table 1).

In the foregoing example, the backup DRAM IC U9 is used to repair one failed IC in the regular DRAM ICs U1-U8 only. However, the repair capability of the repairable memory module of the invention is not limited to this. It can be used to repair a maximum of four failed ICs in the module. Fundamentally, the maximum repair capacity of the repairable memory module of the invention, i.e., the maximum number of failed ICs in the module that can be repaired, is equal to the number of the I/O pins of the backup memory IC. Two examples of such a repair work are respectively given in Tables 2 and 3.

TABLE 2

| Failed IC | Failed I/O | U1–U8 Jumper | U9 Jumper |
|---|---|---|---|
| U1 | RD0 | DQ0 ←→ SP0 (J0) | $\overline{CAS0}$ ←→ $\overline{CAS}$ |
| U1 | RD1 | DQ1 ←→ SP1 (J1) | $\overline{CAS0}$ ←→ $\overline{CAS}$ |
| U1 | RD2 | DQ2 ←→ SP2 (J2) | $\overline{CAS0}$ ←→ $\overline{CAS}$ |
| U1 | RD3 | DQ3 ←→ SP3 (J3) | CAS0 ←→ CAS |

TABLE 3

| Failed IC | Failed I/O | U1–U8 Jumper | U9 Jumper |
|---|---|---|---|
| U1 | RD0 | DQ0 ←→ SP0 (J0) | $\overline{CAS0}$ ←→ $\overline{CAS}$ |
| U1 | RD3 | DQ3 ←→ SP1 (J3) | $\overline{CAS0}$ ←→ $\overline{CAS}$ |
| U3 | RD4 | DQ4 ←→ SP2 (J4) | $\overline{CAS0}$ ←→ $\overline{CAS}$ |
| U3 | RD7 | DQ7 ←→ SP3 (J7) | CAS0 ←→ CAS |

Beside the connections shown in Tables 2 and 3, the jumping pads in the first row 510 that are associated with the unfailed I/O pins on the unfailed ICs are connected respectively to the corresponding ones in the second row 520. In the case of Table 3, the unfailed I/O pins on the unfailed ones of the regular DRAM ICs U1-U8 are connected as follows: the first and second jumping pads on the respective I/O jumping-pad units J1, J2, J5, J6, J9-J16, J18-J25, J27-J34 are short-circuited to each other; and moreover, the second and third jumping pads on the I/O jumping-pad units J0, J3, J4, J7 are also short-circuited to each other.

Figure 6:
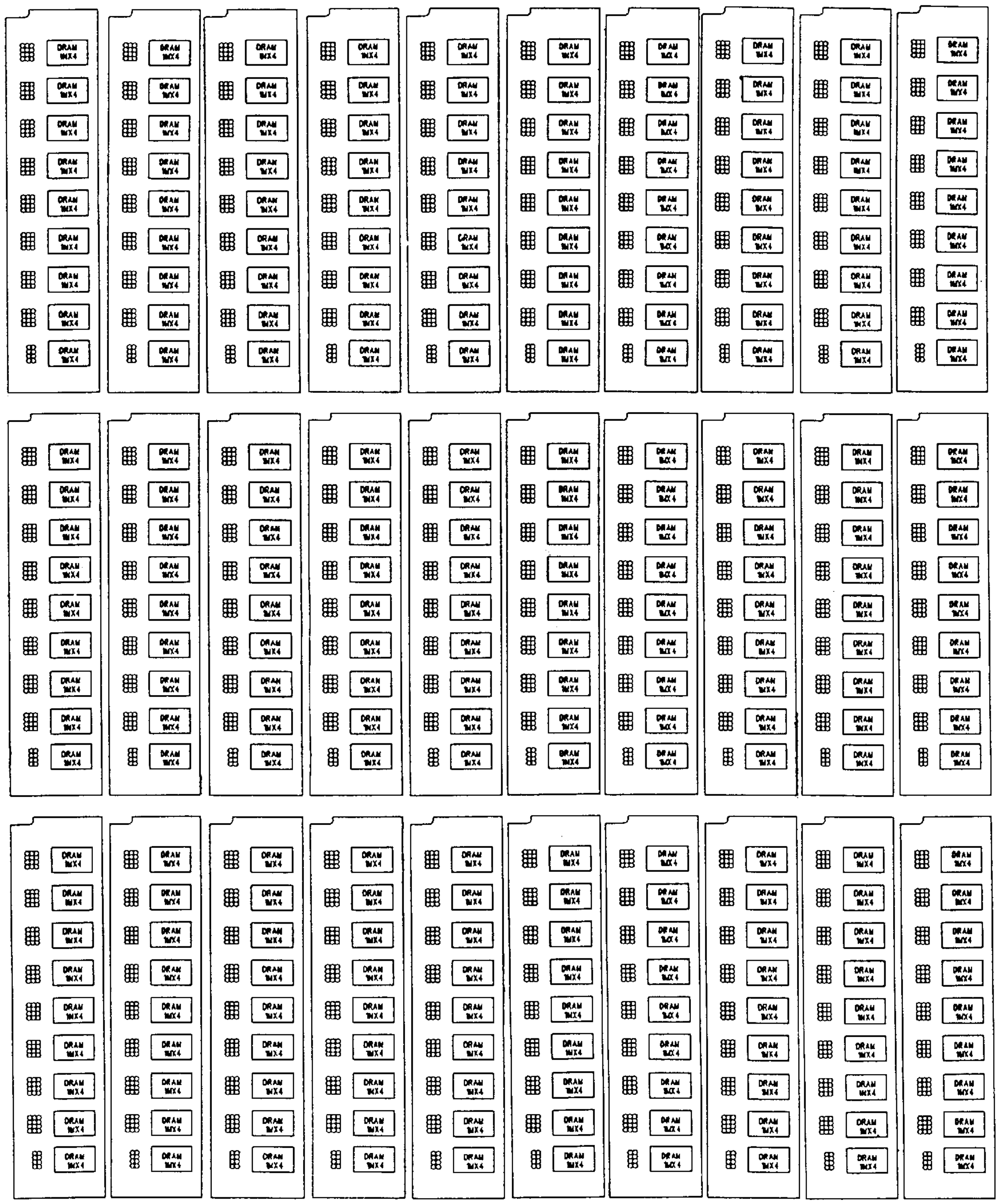
FIG. 6 shows an array of repairable DRAM module of the invention that are arranged together on a printed circuit board for chip-probe testing.

The repairable memory module of the invention can be arranged in an array, as shown in FIG. 6, for chip-probe testing. This allows the testing to be performed concurrently on a number of modules.

To test the I/O pins and the column-address strobe pins, the probe can touch on the first row of jumping pads 510 associated with the regular DRAM ICs U1-U8 and the first row of jumping pads 540 associated with the backup DRAM IC U9. To test the address pins and other control pins, the probe can touch the pads associated with the I/O pins on the module I/O bus. Alternatively, these address pins and control pins can be arranged proximate to the jumping pads for convenient testing.

In conclusion, the repairable memory module of the invention has several obvious advantages over the prior art.

First, if the repairable memory module is based on COB structure, the backup DRAM IC can be mounted along with the regular DRAM ICs U1-U8 or later until failed ICs are found therein. In either case, the failed ICs can be repaired by using the backup DRAM IC. Second, if the repairable memory module is constructed with packaged memory ICs. This can save some manufacturing cost since the memory modules need not to be mounted with the extra backup DRAM IC. Third, the use of the backup DRAM IC to repair the failed ones is very convenient to carry out by the technicians. Fourth, if no failed ICs are found before shipment, the layout area for the backup DRAM IC can be reserved until later in use any failed ICs are found. Until then, a backup DRAM IC is mounted to repair the failed ICs in the failed module. Fifth, in module testing, the repairable memory module can be arranged in an array, allowing the test to be performed concurrently on a number of modules. This can significantly increase the efficiency of the testing.

The invention has been described using exemplary preferred embodiments. However, it is to be understood that the scope of the invention is not limited to the disclosed embodiments. On the contrary, it is intended to cover various modifications and similar arrangements. The scope of the claims, therefore, should be accorded the broadest interpretation so as to encompass all such modifications and similar arrangements.

What is claimed is:

1. A repairable memory module, comprising:

a printed circuit board;

a plurality of regular memory ICs mounted on said printed circuit board;

at least one backup memory IC selectively mounted on said printed circuit board when required, said backup memory IC being used to repair any failed one of said regular memory ICs;

a module I/O bus having a plurality of I/O pins for said memory module;

a number of I/O jumping-pad units, each I/O jumping-pad unit being associated with one of said regular memory ICs, each I/O jumping-pad unit being arranged into at least three rows of jumping pads with the number of jumping pads in each row being equal to the number of I/O pins on the associated memory IC; and at least one CAS jumping-pad unit associated with said backup memory IC, said CAS jumping-pad unit being arranged into at least two rows of jumping pads with the number of jumping pads in each row being equal to the number of CAS pins on said module I/O bus;

wherein in each of said I/O jumping-pad units, the first row of jumping pads are connected respectively to the I/O pins on the associated one of said regular memory ICs; the second row of jumping pads are connected respectively to the corresponding I/O pins on the module I/O bus; and the third row of jumping pads are connected respectively to the I/O pins on the backup memory IC;

wherein in said CAS jumping-pad unit, the first row of jumping pads are connected together to the CAS pin on the backup memory IC; and the second row of jumping pads are connected respectively to the corresponding CAS pins on the module I/O bus; and wherein provided that all of the regular memory ICs are OK, the first row of jumping pads in each of said I/O jumping-pad units are short-circuited to the second row of jumping pads in the same; and provided that at least one of the regular memory ICs is a failed one, those jumping pads in the second row of jumping pads that are associated with the failed I/O pins on the failed memory IC are short-circuited to the corresponding jumping pads in the third row; those jumping pads in the first row of jumping pads that are associated with the unfailed I/O pins on the regular memory ICs are short-circuited to the corresponding jumping pads in the second row; and those jumping pads in the first row of the CAS jumping-pad unit that are associated with the failed memory ICs are short-circuited to the corresponding jumping pads in the second row.

2. The memory module of claim 1, wherein said regular memory ICs and said backup memory IC are mounted on the printed circuit board in packaged form.

3. The memory module of claim 1, wherein said regular memory ICs and said backup memory IC are mounted on the printed circuit board by chip-on-board.

4. The memory module of claim 1, wherein said regular memory ICs are mounted on said printed circuit board by chip-on-board while the backup memory IC is mounted on said printed circuit board in packaged form.

5. The memory module of claim 1, wherein the short-circuited connections are realized by using a set of zero-ohm resistors.

6. The memory module of claim 1, wherein the short-circuited connections are realized by using a set of jumpers.

7. A method for use on a memory module having an array of regular memory ICs and a module I/O bus associated with the regular memory ICs for repairing at least one failed one of the regular memory ICs in the memory module, said method comprising the steps of:

(1) providing a backup memory IC of the same type as the regular memory ICs;

(2) short-circuiting the failed I/O pins on the failed memory IC to the corresponding I/O pins on the backup memory IC;

(3) short-circuiting the unfailed I/O pins on the regular memory ICs to the corresponding I/O pins on the module I/O bus; and (4) short-circuiting the CAS pin on the backup memory IC to the corresponding CAS pins on the module I/O bus that are associated with the failed memory IC.

8. The method of claim 7, further comprising the steps of:

providing a number of I/O jumping-pad units, each I/O jumping-pad unit being associated with one of said regular memory ICs, each I/O jumping-pad unit being arranged into at least three rows of jumping pads with the number of jumping pads in each row being equal to the number of I/O pins on the associated memory IC; in each of said I/O jumping-pad units, the first row of jumping pads being connected respectively to the I/O pins on the associated one of said regular memory ICs; the second row of jumping pads being connected respectively to the corresponding I/O pins on the module I/O bus; and the third row of jumping pads being connected respectively to the I/O pins on the backup memory IC; and providing at least one set of CAS jumping pads associated with said backup memory IC, said CAS jumping-pad unit being arranged into at least two rows of jumping pads with the number of jumping pads in each row being equal to the number of CAS pins on said module I/O bus; in said CAS jumping-pad unit, the first row of jumping pads being connected together to the CAS pin on the backup memory IC; and the second row of jumping pads being connected respectively to the corresponding CAS pins on the module I/O bus.

9. The memory module of claim 8, wherein the short-circuited connections are realized by mounting a set of zero-ohm resistors respectively on the short-circuited pairs of the jumping pads.

10. The memory module of claim 8, wherein the short-circuited connections are realized by mounting a set of jumpers respectively on the short-circuited pairs of the jumping pads.

* * * * *